(12) United States Patent
Jang et al.

(10) Patent No.: US 11,038,039 B2
(45) Date of Patent: Jun. 15, 2021

(54) METHOD OF FORMING A SEMICONDUCTOR DEVICE

(71) Applicant: IMEC vzw, Leuven (BE)

(72) Inventors: Doyoung Jang, Heverlee (BE); Min-Soo Kim, Kessel-Lo (BE)

(73) Assignee: IMEC vzw, Leuven (BE)

( * ) Notice: Subject to any disclaimer, the term of this patent is extended or adjusted under 35 U.S.C. 154(b) by 44 days.

(21) Appl. No.: 16/675,588

(22) Filed: Nov. 6, 2019

(65) Prior Publication Data

US 2020/0152770 A1 May 14, 2020

(30) Foreign Application Priority Data

Nov. 14, 2018 (EP) .................................. 18206267

(51) Int. Cl.
*H01L 29/66* (2006.01)
*H01L 21/8234* (2006.01)
*H01L 29/06* (2006.01)

(52) U.S. Cl.
CPC .................. *H01L 29/66545* (2013.01); *H01L 21/823431* (2013.01); *H01L 29/0673* (2013.01); *H01L 29/66795* (2013.01)

(58) Field of Classification Search
None
See application file for complete search history.

(56) References Cited

U.S. PATENT DOCUMENTS 8,063,450 B2 11/2011 Wernersson et al.
8,530,974 B2 9/2013 Cheng et al.
(Continued)

FOREIGN PATENT DOCUMENTS

JP 2014/107569 6/2014
WO WO 2015/094648 A1 6/2015

OTHER PUBLICATIONS

Extended European Search Report dated May 14, 2019 for European Patent Application No. 18206267.9 in 6 pages.
(Continued)

*Primary Examiner* — J. E. Schoenholtz
(74) *Attorney, Agent, or Firm* — Knobbe, Martens, Olson & Bear, LLP (57) ABSTRACT

In one aspect, a method of forming a semiconductor device includes removing a first dummy gate part extending across a first fin within a first gate trench section in an insulating layer, wherein the first dummy gate part is removed selectively to a second dummy gate part extending across a second fin within a second gate trench section in the insulating layer, and wherein each of the first and second fins is formed by a layer stack including a first layer and a second layer on the first layer, the first layer including $Si_{1-x}Ge_x$ and the second layer including $Si_{1-y}Ge_y$, wherein $0 \leq x \leq 1$ and $0 \leq y \leq 1$ and $x \neq y$. The method includes forming a silicon capping layer on a portion of the first fin exposed in the first gate trench section, performing an oxidation process to oxidize the silicon capping layer and to oxidize an outer thickness portion of the portion of the first fin such that a trimmed fin portion including laterally trimmed first and second layer portions remains inside the oxidized outer thickness portion, and subsequent to performing the oxidation process, removing the second dummy gate while the oxidized silicon capping layer and the oxidized outer thickness portion covers the trimmed fin portion. The method also includes removing the oxidized silicon capping layer and the oxidized outer thickness portion from the trimmed fin portion, removing the laterally trimmed first layer portion exposed in the first gate trench section and a first layer portion exposed in the second gate trench section, and forming a final gate structure around the laterally trimmed (Continued)

second layer portion in the first gate trench section and around a second layer portion in the second gate trench section.

18 Claims, 9 Drawing Sheets

(56) References Cited

U.S. PATENT DOCUMENTS

| | | | |
|---|---|---|---|
| 9,178,036 B1 | 11/2015 | Xie et al. | |
| 9,219,119 B2 | 12/2015 | Sun et al. | |
| 9,245,989 B2 | 1/2016 | Then et al. | |
| 10,074,575 B1* | 9/2018 | Guillorn | H01L 29/66545 |
| 2010/0295022 A1 | 11/2010 | Chang et al. | |
| 2012/0235247 A1 | 9/2012 | Cai et al. | |
| 2015/0008483 A1 | 1/2015 | Ching et al. | |
| 2016/0086943 A1 | 3/2016 | Lee et al. | |
| 2016/0247731 A1 | 8/2016 | Balakrishnan et al. | |
| 2017/0005090 A1 | 1/2017 | Ando et al. | |
| 2017/0005195 A1* | 1/2017 | Ching | H01L 29/165 |
| 2017/0077232 A1 | 3/2017 | Balakrishnan et al. | |
| 2017/0104062 A1 | 4/2017 | Bi et al. | |
| 2020/0035840 A1* | 1/2020 | Vellianitis | H01L 29/0653 |
| 2020/0105617 A1* | 4/2020 | Wang | H01L 29/0673 |
| 2020/0168715 A1* | 5/2020 | Wu | H01L 29/401 |

OTHER PUBLICATIONS

Cheng et al., "Characterizing the electrical properties of raised S/D junctionless thin-film transistors with a dual-gate structure", Nanoscale Research Letters, vol. 9, No. 669, 7 pages, 2014.

Liao et al., "Multi-Threshold Design Methodology of Stacked Si-Nanowire FETs", IEEE, Conference Paper, 3 pages, Oct. 2014.

Shreya et al., "Performance Analysis of CNTFET Based Digital Logic Circuits", IEEE, Conference Paper, 6 pages, May 2014.

Singh et al., "Ultra-Narrow Silicon Nanowire Gate-All-Around CMOS Devices: Impact of Diameter, Channel-Orientation and Low Temperature on Device Performance", IEEE, Conference Paper, 4 pages, Dec. 2006.

Subramaniam et al., Analytical modeling and numerical simulation of novel double-gate InGaAs vertical nanowire transistor device for threshold voltage tuning and improved performance, Eng. Sci. Tech., Int. J., vol. 19, Issue 4, pp. 1857-1863, 2016.

* cited by examiner

METHOD OF FORMING A SEMICONDUCTOR DEVICE

CROSS-REFERENCE TO RELATED APPLICATIONS

This application claims foreign priority to European Patent Application No. EP 18206267.9, filed Nov. 14, 2018, the content of which is incorporated by reference herein in its entirety.

BACKGROUND

Field

The disclosed technology generally relates to semiconductor devices, and more particularly, to methods of forming semiconductor devices.

Description of the Related Technology

The gate all around (GAA) transistors, for instance the nanowire field effect transistor (NW-FET), are strong candidates to enable technology scaling beyond the fin field effect transistor (FinFET) device architecture. Among others, an improved electrostatic control can enable gate length reduction, which is an enabler for continued technology scaling.

Complementary metal oxide semiconductor (CMOS) devices typically involve fabricating devices with different drive currents and threshold voltages side-by-side. For instance, high performance devices supporting high drive currents and low threshold voltage (low Vt) (e.g., LVT devices) and low power devices supporting lower drive currents and high threshold voltage (high Vt) (e.g., standard threshold voltage/high threshold voltage—SVT/HVT devices) may be fabricated on a same substrate.

There is a need for improved integration processes allowing fabrication of GAA transistors supporting different drive currents and/or threshold voltages on a same substrate.

SUMMARY OF CERTAIN INVENTIVE ASPECTS

An objective of the disclosed technology is to address this need. Further and alternative objectives may be understood from the following.

According to an aspect of the disclosed technology, there is provided a method of forming a semiconductor device, the method can comprise:
  removing a first dummy gate part extending across a first fin within a first gate trench section in an insulating layer,
    wherein the first dummy gate part is removed selectively to a second dummy gate part extending across a second fin within a second gate trench section in the insulating layer, and
    wherein each of the first and second fins is formed by a layer stack comprising a first layer and a second layer on the first layer, the first layer comprising $Si_{1-x}Ge_x$ and the second layer comprising $Si_{1-y}Ge_y$, wherein $0 \leq x \leq 1$ and $0 \leq y \leq 1$ and $x \neq y$,
  forming a silicon capping layer on a portion of the first fin exposed in the first gate trench section,
  performing an oxidation process to oxidize the silicon capping layer and to oxidize an outer thickness portion of the portion of the first fin such that a trimmed fin portion comprising laterally trimmed first and second layer portions remains inside the oxidized outer thickness portion,
  subsequent to performing the oxidation process, removing the second dummy gate while the oxidized silicon capping layer and the oxidized outer thickness portion covers the trimmed fin portion,
  removing the oxidized silicon capping layer and the oxidized outer thickness portion from the trimmed fin portion,
  removing the laterally trimmed first layer portion exposed in the first gate trench section and a first layer portion exposed in the second gate trench section, and
  forming a final gate structure around the laterally trimmed second layer portion in the first gate trench section and around a second layer portion in the second gate trench section.

The disclosed technology can enable forming of a semiconductor device comprise a first gate all around transistor and a second gate all around transistor. The first transistor can comprise a channel defined in a channel layer which has been selectively subjected to a lateral trimming process (e.g., a laterally trimmed second layer portion). The second transistor can comprise a channel defined in a channel layer formed by the (e.g, non-trimmed) second layer portion. Accordingly, the second layer portion in the second gate trench section may be formed with a cross-sectional/lateral dimension which is greater than the laterally trimmed second layer portion.

The laterally trimmed second channel layer portion in the first gate trench section can enable improved electrostatic control. Conversely, the greater lateral dimension of the (non-trimmed) second layer portion in the second gate trench section can enable support for a greater drive current. Transistor devices supporting different drive currents and/or threshold voltages (e.g., multi-threshold devices) may hence be formed on a same substrate without varying the number of stacked layers of the first and second fin. Providing a greater number of stacked layers in the second fin could cause varying amounts of parasitic capacitance at the first and second transistor device. This could in turn lead to reduced circuit speed and increased power consumption.

A further advantage of the lateral trimming of the second channel layer portion is that an available volume for the gate structure may be increased.

The disclosed technology may be readily implemented in a replacement metal gate flow wherein the presence of the dummy gate part allows the trimming process to be selectively applied to the first fin by removing the first dummy gate part while preserving the second dummy gate part.

The oxidized silicon capping layer and the oxidized outer thickness portion may mask the (laterally trimmed) portion of the first fin during at least a part of the removing of the second gate structure. In some instances, the second gate structure may be removed by etching wherein the oxidized silicon capping layer and the oxidized outer thickness portion may act as an etch mask during the etching.

The forming of the silicon capping layer on the first fin can make it possible that a masking oxide of sufficient quality and thickness is formed, also on semiconductor layers having a lower tendency to oxidize. Moreover, the silicon capping layer can provide a degree of design flexibility in terms of the amount of lateral trimming of the first and second layer portions. For example, the dimension of the outer thickness portion to be oxidized may be selected in view of the amount of trimming to be effected without, or at least with less, consideration of the thickness of the masking oxide.

By removing the oxidized silicon capping layer and the oxidized outer thickness portion, the trimmed fin portion comprising the laterally trimmed first and second layer portions may be exposed in the first gate trench section.

According to the disclosed technology, the laterally trimmed first layer portion exposed in the first gate trench section and the first layer portion exposed in the second gate trench section can be removed, e.g., selectively to the laterally trimmed second layer portion in the first gate trench section and the second layer portion in the second gate trench section. Circumferentially extending peripheral surfaces (e.g., a pair of sidewall surfaces and a bottom and top wall surface) of the second layer portions may accordingly be laid bare. Thus the second layer portions may be suspended within their respective gate trench sections.

Each one of the first and the second fin may be a fin-shaped semiconductor structure extending along and protruding above a substrate. The first fin may extend along a first fin track (e.g., a first geometrical straight line along the substrate). The second fin may extend along a second fin track (e.g., a second geometrical straight line along the substrate). The first fin and the second fin may extend in parallel to each other.

The first and second layers of the layer stack of each fin may be a first and second nanowire or a first and a second nanosheet.

The terminology "using a layer as an etch mask" refers to the layer acting as an etch mask counteracts etching in regions covered by the layer. Regions exposed by the etch mask may accordingly be etched while regions covered by the etch mask need not be affected appreciably.

Etching or removal of a feature "A", selectively to a feature "B", refers to a feature A arranged adjacent to a feature B may be removed while preserving the feature B. This may be achieved by covering the feature B to be preserved by an etch mask. This may also be achieved by exposing the features A and B to an etch process wherein the feature A is etched at a greater rate than the feature B. Hence, portions of the feature A exposed to the etching process may be removed while portions of the feature B exposed to the etch process may be preserved. The preservation of the feature B following the etch process may be complete (in the sense that the feature B is not affected appreciably during the etch process) or at least partial (in the sense that the feature B remains at least to the extent that it may serve its intended function during subsequent process steps). A ratio of an etch rate of the material of feature A compared to an etch rate of the material of feature B may advantageously be 2:1 or higher, 10:1 or higher, 40:1 or higher, or a ratio within a range defined by any of these ratios.

The first dummy gate part may be formed on a dummy oxide covering the first fin. Subsequent to removing the first dummy gate part the dummy oxide may be removed from the first fin, thereby exposing a portion of the first fin in the first gate trench section.

The second dummy gate part may be formed on a dummy oxide covering the second fin. The method can comprise, subsequent to removing the second dummy gate part, removing the dummy oxide from the second fin, the oxidized silicon capping layer and the oxidized outer thickness portion using an oxide etch.

Accordingly, the oxidized silicon capping layer and the oxidized outer thickness portion may act as an etch mask for the laterally trimmed first and second layer portions during removing of the second dummy gate part. Subsequently, the oxidized silicon capping layer and the oxidized outer thickness portion may be removed simultaneous to the dummy oxide. The trimming may accordingly be achieved by a comparably small number of additional process.

The dummy gate parts may be formed by polysilicon. Polysilicon may be etched with an advantageous degree of selectivity in relation to a silicon oxide.

The method may further comprise forming a mask layer covering the first gate trench section and defining an opening above the second dummy gate part,
   opening a dummy gate cap layer formed on the second dummy gate part to expose an upper surface of the second dummy gate part,
   removing the mask layer, and
   thereafter removing the second dummy gate part.

Surfaces exposed in the first gate trench section, among others the oxidized silicon capping layer and the oxidized outer thickness may thus be masked during a potentially harsh etching process used for removing a dummy gate cap layer, for instance of a hard mask material such as a nitride-based material.

The first and second dummy gate parts may form part of a common continuous dummy gate extending across both the first and second fins. The method may hence be employed to enable fabrication of transistor devices supporting different drive currents and/or threshold voltages (e.g., multi-threshold devices) along a same dummy gate. Correspondingly, the first and second gate trench sections may form part of a common continuous gate trench in which the common dummy gate extends.

The first and second fins may advantageously be formed with a same lateral dimension and with a same height. Hence, the fins may be efficiently formed using standard fin patterning techniques. A height of a fin may here be understood as a height above a substrate supporting the fin. Equivalently, a height of a fin may be understood as a height above a bottom insulating layer (such as a shallow-trench-insulation, STI) covering an upper surface of a substrate supporting the fin.

The first and second fins may be formed by patterning the first and second fins in an epitaxial layer stack comprising a first epitaxial layer and a second epitaxial layer on the first epitaxial layer, wherein the first layer of the first fin is formed by a first remaining portion of the first epitaxial layer, the second layer of the first fin is formed by a first remaining portion of the second epitaxial layer, and wherein the first layer of the second fin is formed by a second remaining portion of the first epitaxial layer, the second layer of the second fin is formed by a second remaining portion of the second epitaxial layer.

The first and second fins may hence be formed simultaneously in a same layer stack using a common patterning process.

The silicon capping layer can be epitaxially grown on the portion of the first fin. A high quality silicon capping layer may hence be formed on the portion of the first fin exposed in the first gate trench section. Formation by epitaxy allows the silicon capping layer to be formed selectively on exposed semiconductor surfaces in the first gate trench section, in particular on the exposed portion of the first fin.

The portion of the first fin and the portion of the second fin may protrude above a bottom insulating layer (such as an STI layer) covering an upper surface of a semiconductor substrate, wherein the trench insulating layer can cover the upper surface during the forming of the silicon capping layer.

Presence of a bottom insulating layer during epitaxial growth of a silicon capping layer can counteract formation of a silicon layer on the upper surface of the substrate.

The first layer of the layer stack of each fin can comprise, or consist of, $Si_{1-x}Ge_x$. The second layer of the layer stack of each fin can comprise, or consist of, $Si_{1-y}Ge_y$. In various cases, the first and second layers can be formed by different materials (e.g., x≠y). This can enable the first layer portions in the first and second gate trench sections to be removed selectively from the second layer portions.

The first layer of the first and second fins may be Ge- or SiGe-layers and the second layer of the first and second fins may be Si-layers. Thereby, transistors with Si-channels may be formed.

Alternatively, the first layer of the first and second fins may be Si- or SiGe-layers and the second layer of the first and second fins may be Ge-layers. Thereby, transistors with Ge-channels may be formed.

The forming of the final gate structure may comprise depositing a gate dielectric and a gate electrode around the second layer portions in the first and second gate trench sections.

The method may further comprise subjecting the laterally trimmed first and second layer portions to a hydrogen annealing process. Hydrogen annealing may induce a surface redistribution of atoms forming the semiconductor material of the second layer portions which tends to result in a rounding of the cross-sectional profile of the second layer portions. A rounding of the profile of the second layer portions can enable of a rounding of the channel structures, which may further contribute to the electrostatic control of the channels. Hydrogen annealing may be performed subsequent to exposing the portion of the first fin in the first gate trench section and prior to forming the silicon capping layer. Alternatively or additionally hydrogen annealing may be performed subsequent to removing the first layer portions in the first and second gate trench sections.

The first dummy gate part may extend across a first portion of a plurality of parallel first fins, each first fin can comprise a respective first layer comprising $Si_{1-x}Ge_x$ and a respective second layer comprising $Si_{1-y}Ge_y$. Accordingly, a plurality of first gate all around transistors may be formed, each can comprise a channel defined in a channel layer which has been selectively subjected to a lateral trimming process (e.g., a laterally trimmed second layer portion). In some instances, the method may comprise:

forming a silicon capping layer on each fin portion exposed in the first gate trench section, oxidizing the silicon capping layer on each fin portion and an outer thickness portion of each fin portion such that a respective laterally trimmed fin portion remains inside each oxidized outer thickness portion, removing each first layer portion exposed in the first gate trench section, and forming a final gate structure around each laterally trimmed second layer portion in the first gate trench section.

The second dummy gate part may extend across a respective portion of a plurality of parallel second fins, each second fin can comprise a respective first layer comprising $Si_{1-x}Ge_x$ and a respective second layer comprising $Si_{1-y}Ge_y$. Accordingly, a plurality of second gate all around transistors may be formed, each can comprise a channel defined in a non-trimmed channel layer. In some instances, the method may comprise:

removing each first layer portion exposed in the second gate trench section, and forming a final gate structure around each second layer portion in the second gate trench section.

BRIEF DESCRIPTION OF THE DRAWINGS

The above, as well as additional objects, features and advantages of the disclosed technology, will be better understood through the following illustrative and non-limiting detailed description, with reference to the appended drawings. In the drawings like reference numerals will be used for like elements unless stated otherwise.

DETAILED DESCRIPTION OF CERTAIN ILLUSTRATIVE EMBODIMENTS

Figure 1:
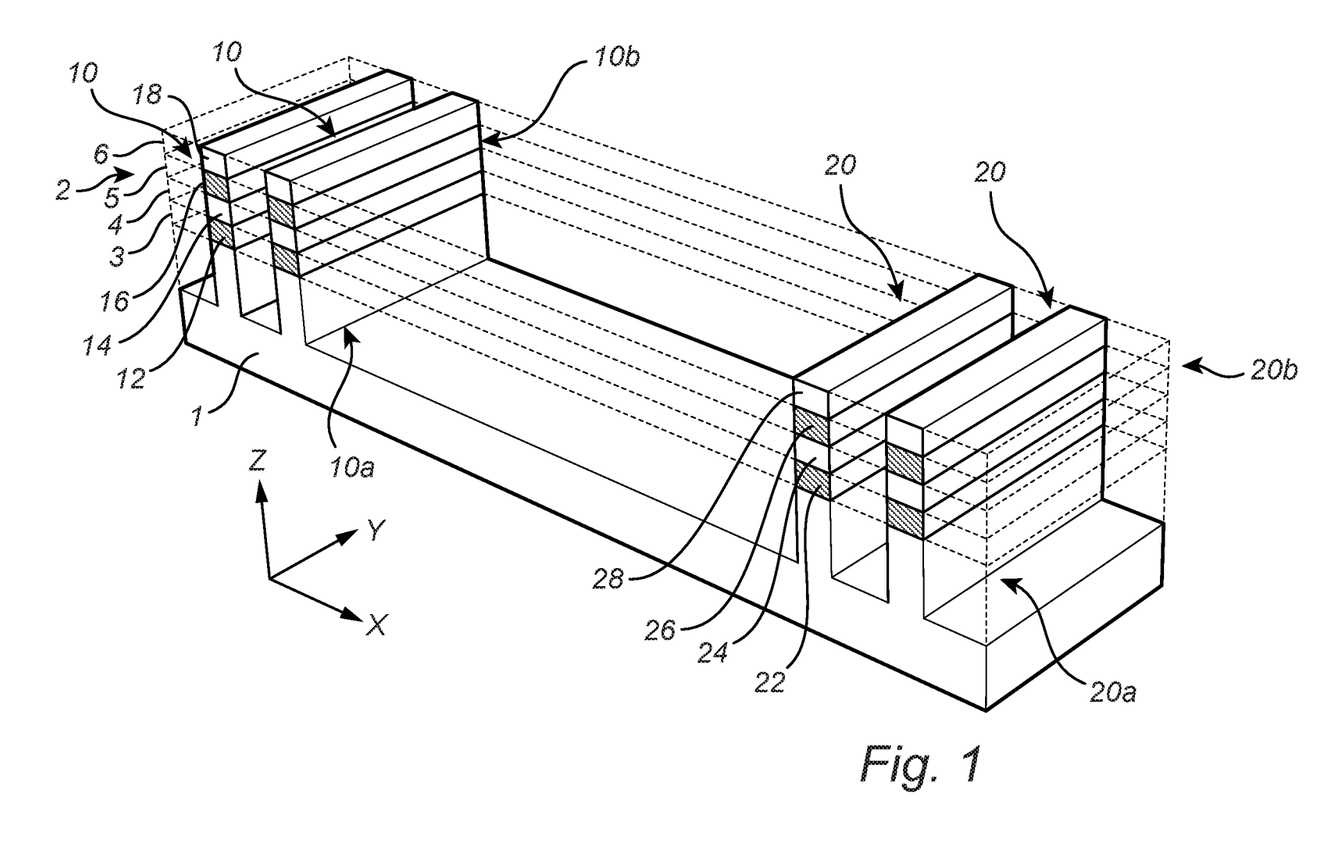
FIGS. 1, 2, 3, 4, 5, 6, 7, 8, and 9 illustrate various intermediate structures of a method of forming a semiconductor device.

With reference to FIG. 1, there is shown, in perspective, a section of an intermediate structure or device. The structure may extend laterally or horizontally beyond the illustrated section. The illustrated planes of section extending through the structure are common to all the figures unless stated otherwise. It is noted that the relative dimensions of the shown elements, in particular the relative thickness of the layers, is merely schematic and may, for the purpose of illustrational clarity, differ from a physical structure. In FIG. 1, directions X and Y indicates a first and a second horizontal direction, respectively, (parallel to the main plane of extension of the layers and the substrate) and Z indicates a vertical direction (normal to the main surface of the layers and the substrate).

FIG. 1 shows a set of first fins 10 and a set of second fins 20. The fins 10, 20 are supported by a substrate 1. The substrate 1 may be a semiconductor substrate, such as a silicon (Si) substrate, a silicon-on-insulator (SOI) substrate, a germanium (Ge) substrate, a SiGe substrate, etc. The fins 10, 20 may, as shown, protrude by a same height above the substrate 1 (e.g., to a same level above the substrate along the vertical direction Z). The fins 10, 20 may be formed with a same lateral dimension or width, e.g., along the first horizontal direction X. Each fin 10, 20 may extend along a respective fin track, parallel to the second horizontal direction Y. The second horizontal direction Y can define a longitudinal dimension or direction of the fins 10, 20.

The first fins 10 may be formed in a first region of the substrate 1 and the second fins 20 may be formed in a second region of the substrate 1. The first region may be a region intended to support SVT or HVT NW-FETs supporting lower power operation. The second region may be a region intended to support LVT NW-FETs supporting high performance operation. For instance, the devices in the first region may form p-type FETs and the devices in the second region may form n-type FETs, or vice versa. Although FIG. 1 shows two fins 10 and two fins 20, it should be noted that any number of first fins 10 and any number of second fins 20 may be formed in each region of the substrate 1.

Each first fin 10 comprises a stack of semiconductor layers 12, 14, 16, 18. The stack of layers comprises an alternating arrangement of first layers 12, 16 and second layers 14, 18. Each second fin 10 can comprise a corresponding stack of semiconductor layers 22, 24, 26, 28. The first layers 12, 16 and 22, 26 can form sacrificial layers. The second layers 14, 18 and 24, 28 can form channel layers. In FIG. 1, each fin 10, 20 comprises a layer stack of four layers. However, each fin 10, 20 may more generally comprise any number of first and second alternatingly arranged layers.

However, each fin 10, 20 may comprise at least one first layer (for instance, first layers 16 and 26, respectively) and at least one second layer (for instance, second layers 18 and 28, respectively).

Each first layer 12, 16, 22, 26 may be a layer of $Si_{1-x}Ge_x$ and each second layer 14, 18, 24, 28 may be a layer of $Si_{1-y}Ge_y$, where $0 \leq x \leq 1$ and $0 \leq y \leq 1$ and $x \neq y$. For instance, each first layer 12, 16, 22, 26 may be a SiGe layer with a Ge content in the range of 20-55% and each second layer 14, 18, 24, 28 may be a layer of Si. However, other configurations are also possible such as first layers of SiGe and second layers of Ge.

As schematically indicated by the dashed lines in FIG. 1, the first and second fins 10, 20 may be formed by patterning trenches in an epitaxial layer stack 2. The layer stack 2 may comprise a number of epitaxial layers corresponding to the intended number of layers of the fins 10, 20. Hence, to form the fins 10, 20 the layer stack 2 may comprise an alternating arrangement of first epitaxial layers 3, 5 and second epitaxial layers, 4, 6 wherein the first epitaxial layers 3, 5 can be layers of $Si_{1-x}Ge_x$ and the second epitaxial layers 4, 6 can be layers of $Si_{1-y}Ge_y$.

Accordingly, following patterning of the layer stack 2, the first layers 12, 16 of the first fin 10 may be formed by a respective remaining portion of the first epitaxial layers 3, 5 and the second layers 14, 18 of the first fin 10 may be formed by a respective remaining portion of the second epitaxial layers 4, 6. Correspondingly, the first layers 22, 26 of the second fin 20 may be formed by a respective remaining portion of the first epitaxial layers 3, 5 and the second layers 24, 28 of the second fin may be formed by a respective remaining portion of the second epitaxial layers 4, 6.

Fin patterning may be performed using conventional patterning techniques and may for instance comprise forming of a patterned hard mask above the layer stack 2 and subsequently etching of the layer stack 2 while using the patterned hard mask as an etch mask. The hard mask may be patterned using any suitable conventional single- or multiple patterning technique. Any state of the art dry or wet etching technique allowing high fidelity patterning of epitaxial Si/Ge layers may be used. As indicated in FIG. 1, the etching may extend completely through the layer stack 2 and into a thickness portion of the substrate 1. Thus, each fin may comprise a lower portion 10a, 20a formed by a patterned portion of the substrate 1 and an upper portion 10b, 20b formed by the stack of first and second layers 12, 14, 16, 18 and 22, 24, 26, 28.

Figure 2:
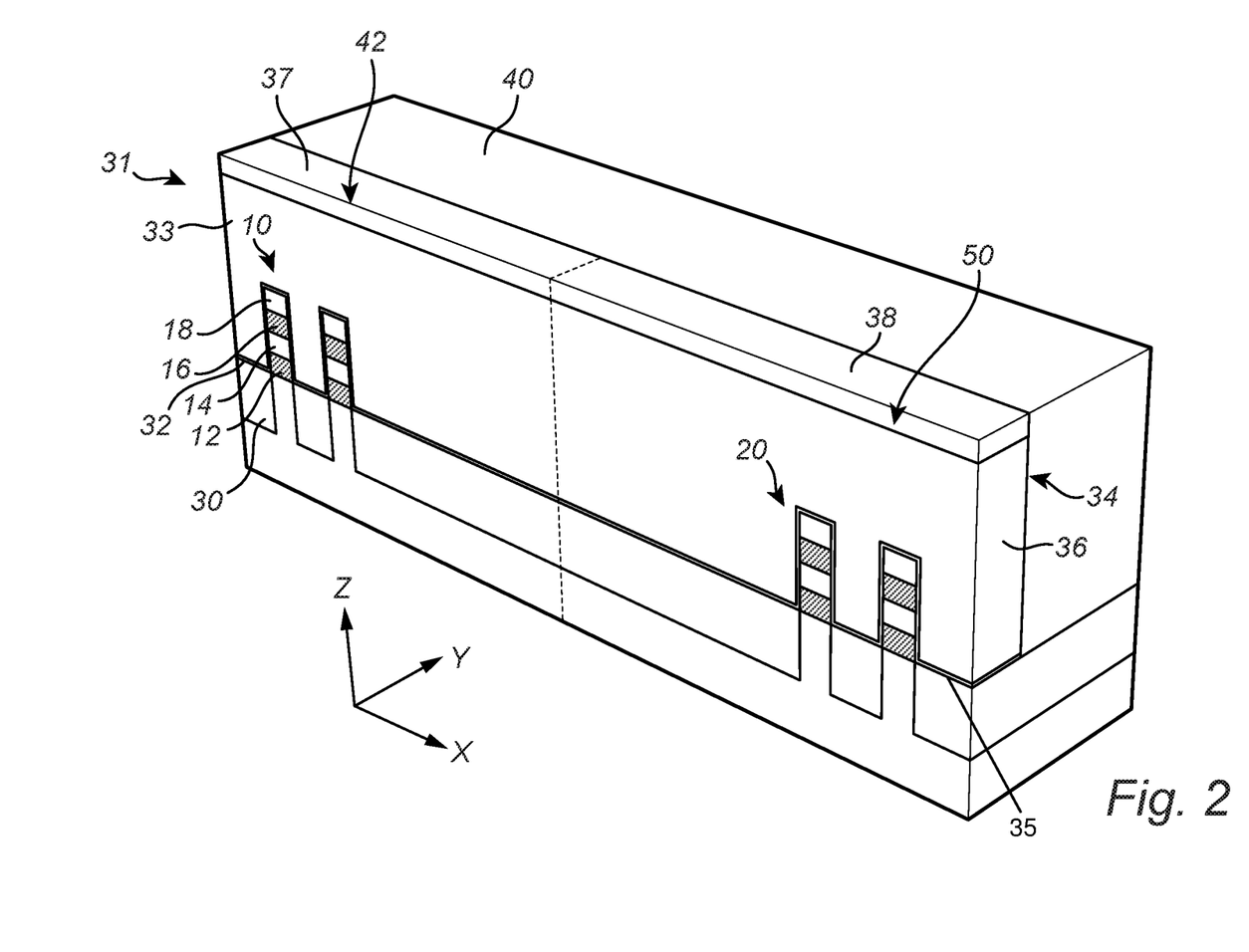

With reference to FIG. 2, a first dummy gate part 33 has been formed to extend across the first fins 10. A second dummy gate part 36 has been formed to extend across the second fins 20. The plane of section can be taken roughly along the center of the dummy gate parts 33, 36, as seen along the second horizontal direction Y. The first dummy gate part 33 extends in a first gate trench section 42 within an insulating layer 40. In other words, the first dummy gate part 33 can be embedded in the insulating layer 40. The second dummy gate part 36 extends in a second gate trench section 50 within the insulating layer 40. In other words, the second dummy gate part 36 can be embedded in the insulating layer 40. The dummy gate parts 33, 36 and the gate trench sections may extend along a gate track, perpendicular to the fin tracks.

The first and second dummy gate parts 33, 36 may, as shown, typically form adjoining parts of a common continuous dummy gate extending across both the first and second fins 10, 20. Correspondingly, the first and second gate trench sections 42, 50 may form adjoining parts of a common continuous gate trench (e.g., in which a common continuous dummy gate extends). Accordingly, the first and second dummy gate parts 33, 36/first second gate trench sections 42, 50 may refer to the parts/sections on opposite sides of the (geometrical) boundary between the device regions. However, the method may in principle also be applied to a structure where the first and second dummy gate parts 33, 36 form part of separate dummy gate structures along a same or along separate gate tracks.

The first dummy gate part 33 and the second dummy gate part 36 may be formed on a respective portion of a dummy oxide 32, 35 covering the first fins 10 and the second fins 20, respectively. The dummy gate part 33, 36 may be capped by a respective dummy gate cap layer part 37, 38. The dummy gate cap layer parts 37, 38 (or shorter "dummy gate caps") may remain following patterning of the dummy gate parts 33, 36. The dummy gate caps 37, 38 may be formed of a nitride-based material, such as SiN. The insulating layer 40 may be an oxide, for instance silicon oxide, or some other low-k dielectric layer. The dummy oxide portion 32, the first dummy gate part 33 and the dummy gate cap part 37 may be commonly referred to as the first dummy gate structure 31. The dummy oxide portion 35, the second dummy gate part 36 and the dummy gate cap part 38 may be commonly referred to as the second dummy gate structure 34.

Forming the first and second dummy gate structures 31, 34 may comprise depositing a dummy oxide layer on the first and second fins 10, 20. A single continuous dummy oxide layer may be a deposited oxide, e.g., by atomic layer deposition (ALD) or chemical vapor deposition (CVD), or a thermal oxide. The portion of the deposited dummy oxide layer covering the first fins 10 and the portion of the deposited dummy oxide layer covering the second fins 20 may form the respective dummy oxide portions 32 and 35. A dummy gate layer may subsequently be deposited on the dummy oxide portions 32 and 35 to cover the fins 10, 20. The dummy gate layer may for instance be a layer of polysilicon. The dummy gate layer may subsequently be patterned to form the dummy gate parts 33 and 36. The patterning may comprise forming a patterned hard mask above the dummy gate layer and subsequently etching the dummy gate layer while using the patterned hard mask as an etch mask. The hard mask may be patterned using any suitable conventional single- or multiple patterning technique. The patterned hard mask may remain on the patterned dummy gate layer to form the respective dummy gate cap parts 37, 38. Following patterning of the dummy gate layer, the insulating layer 40 may be deposited to cover the dummy gate structures 31, 34 and etched back and/or subjected to chemical mechanical polishing (CMP) until exposing upper surfaces of the dummy gate structures 31, 34. Any further number of parallel dummy gate structures may be formed in this fashion to extend across portions of the first and second fins 10, 20, along respective gate tracks.

Although omitted from FIG. 2 for illustrational clarity, a spacer layer may be formed on the sidewalls of the dummy gate structures 31, 34. The spacer layer may for instance be a nitride-based material such as SiN. A spacer layer may be deposited subsequent to patterning the dummy gate layer and prior to depositing the insulating layer 40.

As further shown in FIG. 2, a trench insulating layer or bottom insulating layer 30, for instance in the form of a shallow-trench-insulation, may be deposited to fill the trenches between the fins and thus cover an upper surface of the substrate 1. The bottom insulating layer 30 may be deposited to embed the lower portions of the fins 10, 20 wherein the upper portions of the fins 10, 20 protrude above the bottom insulating layer 30. The bottom insulating layer 30 may, for instance, be formed by a CVD deposited oxide, such as silicon oxide.

Subsequent to forming the dummy gate structures, fin cutting may be performed by etching the first and second fins 10, 20 in regions exposed on opposite sides of the dummy gate structures 31, 34. Source/drain regions may be epitaxially grown on end surfaces of the (cut) fins. Fin cutting and source/drain formation is per se known in the art and will therefore not be further elaborated on herein.

Figure 3:
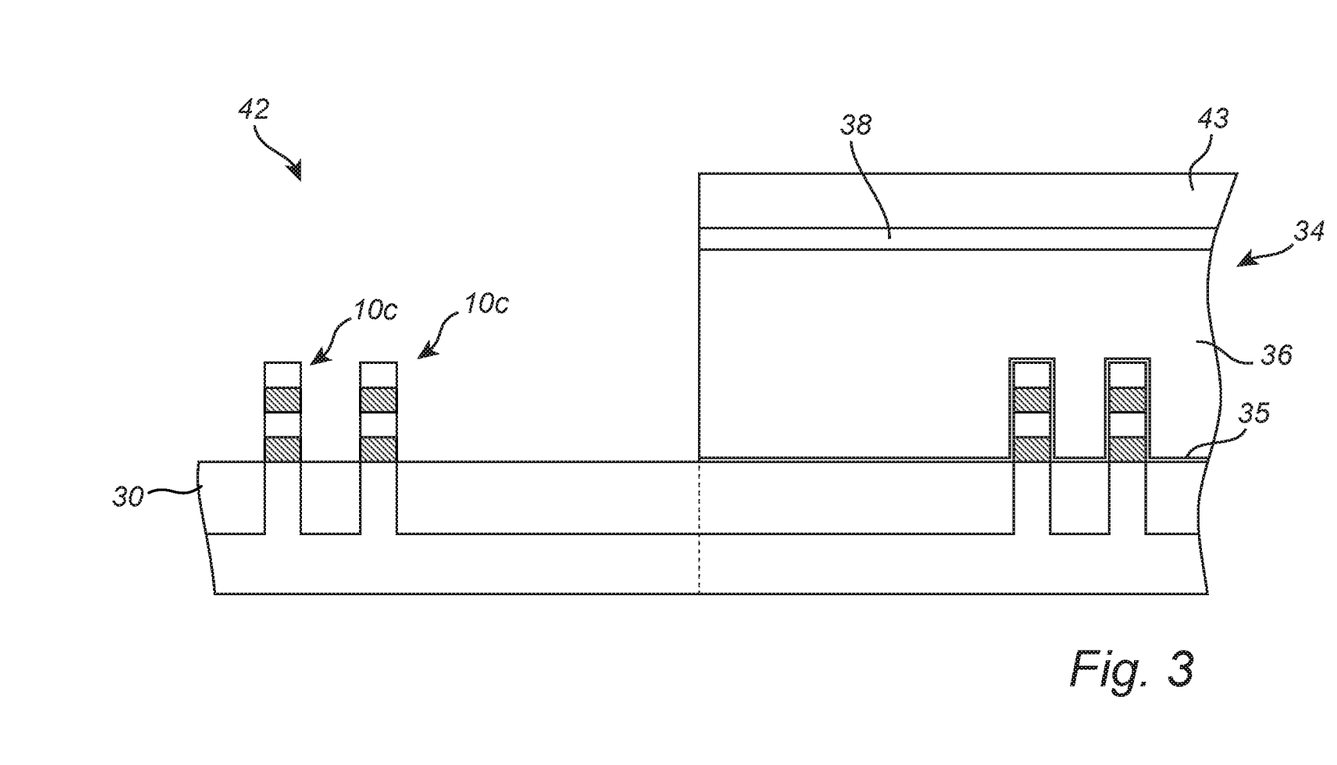

With reference to FIG. 3, a respective portion 10c of each first fin 10 has been exposed within the first gate trench section 42 by removing the first dummy gate structure 31. A bottom surface of the first gate trench section 42 may be formed by an upper surface of the bottom insulating layer 30. The first dummy gate structure 31 can be removed selectively to the second dummy gate structure 34. Accordingly, the second dummy gate structure 34 can remain extending across the second fins 20 following the removal of the first dummy gate structure 31.

Removing of the first dummy gate structure 31 may comprise removing the dummy gate part 33, thereby exposing the dummy oxide portion 32 covering the first fins 10. The respective portions 10c of the first fins 10 may subsequently be revealed within the first gate trench section 42 by removing the dummy oxide portion 32.

A mask layer 43 may be formed to cover the second dummy gate structure 38 and expose the dummy gate cap part 37. The mask layer may comprise a spin-coated photoresist layer wherein the opening may be lithographically defined. The dummy gate cap part 37 may thereafter be removed to expose an upper surface of the first dummy gate part 33. The dummy gate cap part 37 may for instance be removed by a dry etching process, such as reactive ion etching (RIE). Thereafter, the first dummy gate 33 may be removed by etching the exposed upper surface of the dummy gate part 33. The dummy gate part 33 may be etched using any suitable etching process allowing etching of the dummy gate material selectively to the mask layer 34 (or selectively to the dummy gate cap material if the mask layer is removed prior to removing the first dummy gate 33) covering the second dummy gate structure 34 and the material of the insulating layer 40. For instance, a wet polysilicon etch may be used. Finally, the dummy oxide portion 32 may be removed within the first gate trench section 42 using an oxide etch.

Figure 4:
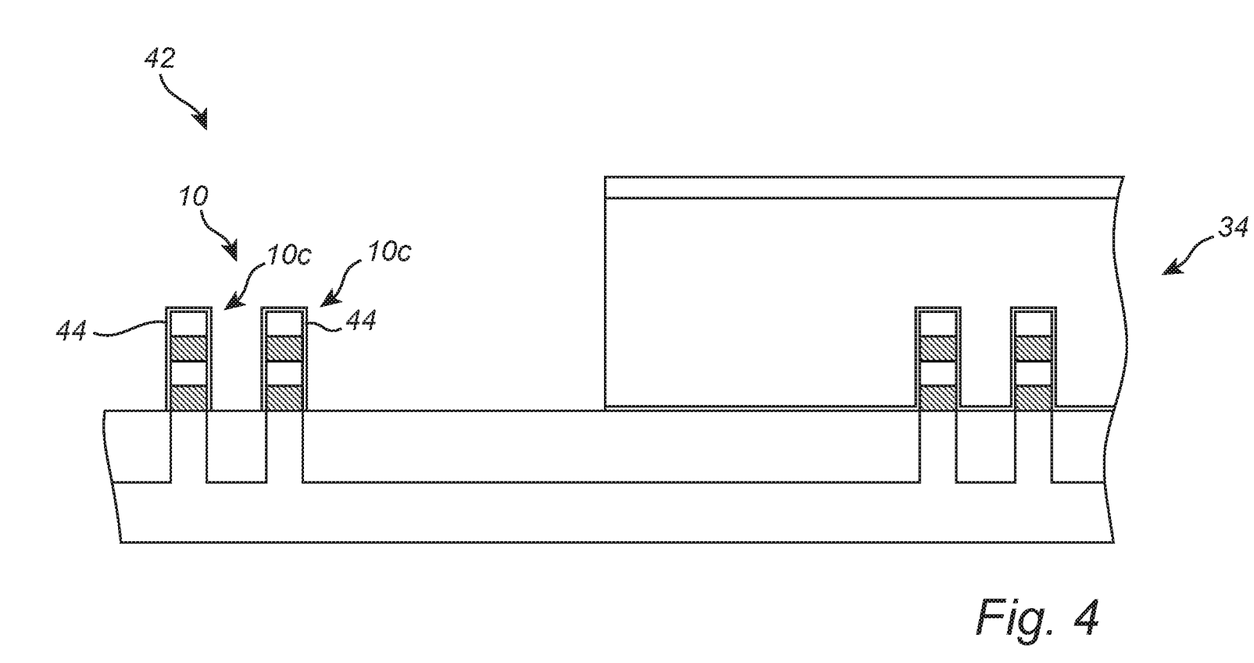

In FIG. 4, a silicon capping layer 44 has been formed on the respective portions 10c of the first fins 10 exposed in the first gate trench section 42. A respective silicon capping layer portion can be formed on each portion 10c of each first fin 10. The silicon capping layer can cover the mutually opposite sidewall surfaces of the portion 10c of each fin 10 and the upper surface thereof.

The silicon capping layer 44 may be epitaxially grown on the exposed portions 10c of the first fins 10. The silicon capping layer 44 may for instance be formed with a thickness of about 1 nm to 5 nm, depending on the desired thickness of the oxidized capping layer, which is to be formed on the first fins 10. Any Si epitaxy process allowing selective epitaxial growth (SEG) of crystalline Si (c-Si) on crystalline Si or SiGe surfaces may be employed. Since the sidewall surfaces and bottom surface of the first gate trench section 42 can be formed by non-crystalline materials (e.g., oxide or nitride), the silicon capping layer 44 may be selectively grown on the exposed crystalline Si and SiGe surfaces of the portions 10c of the first fins 10.

Figure 5:
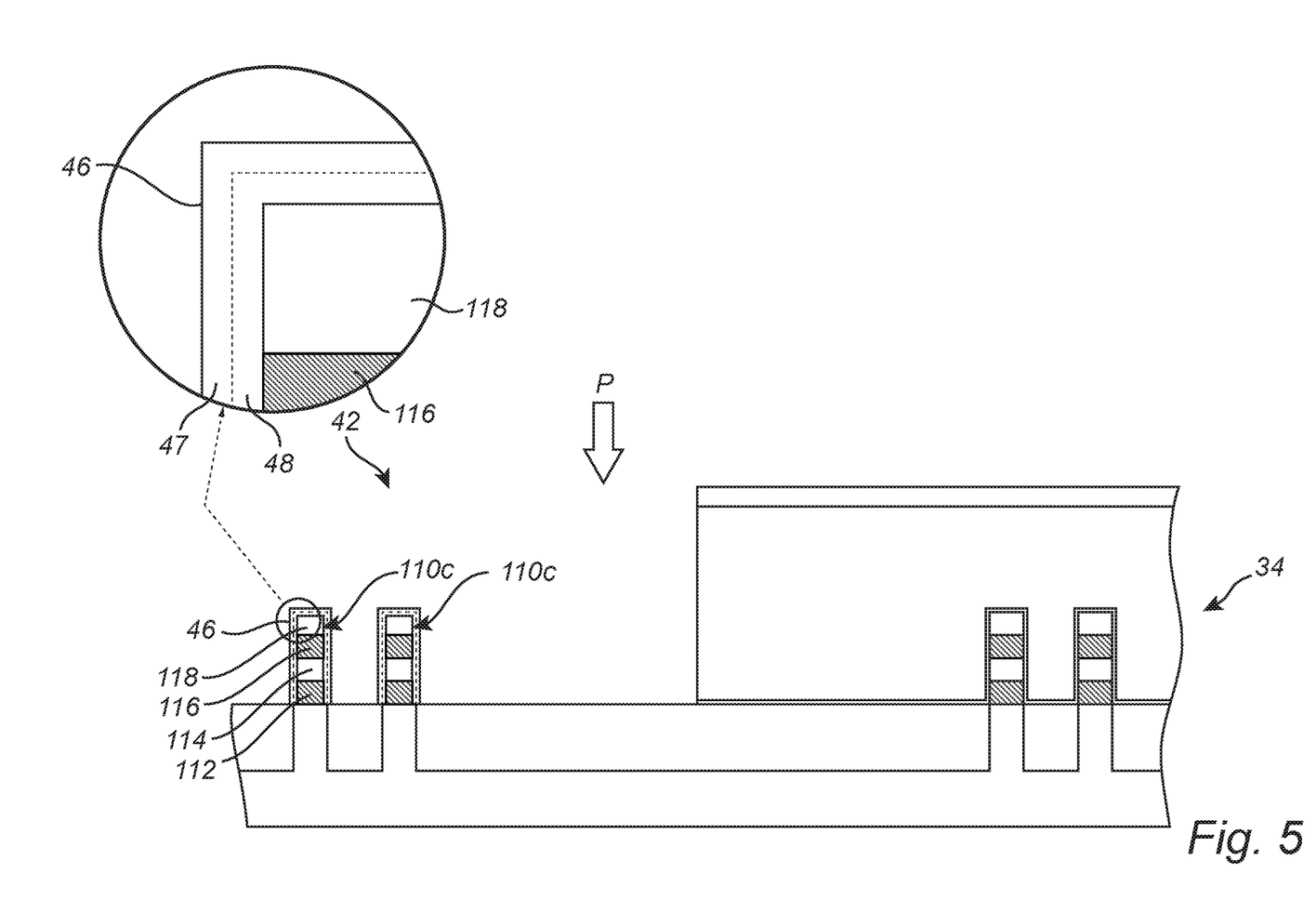

In FIG. 5, the silicon capping layer 44 and an outer thickness portion of each portion 10c of the first fins 10 have been subjected to an oxidation process P. During the oxidation process P, the second fins 20 can be covered by the second dummy gate structure 34. The oxidation process may hence be applied selectively to the first fins 10. For instance, a steam/wet ($H_2O$) oxidation or dry oxidation (in $O_2$ atmosphere) may be performed under suitable process conditions to obtain a desired degree of oxidation. The rate of oxidation in steam and dry oxidation can be as is known in the art dependent on the ambient temperature, pressure as well as on the crystal orientation of the exposed semiconductor structures.

The inset of FIG. 5, provides an enlarged view of the resulting structure. Through the oxidation process P, the silicon capping layer 44 can be oxidized, and thus converted into a silicon oxide capping 47. Each unit of silicon oxide can consume about 0.44 units of silicon. Hence, a thickness of the resulting silicon oxide capping 47 may be approximately double the thickness of the silicon capping layer 44. Through the oxidation process P, the outer thickness portion of each portion 10c of the first fins 10 can be oxidized, and thus converted into an oxide layer 48. Inside the oxide layer 48 remains a trimmed fin portion 110c comprising laterally trimmed first and second layer portions 112, 114, 116, 118. The silicon oxide capping 47 and the oxidized thickness portion 48 may be commonly referred to as oxide layer 46. The oxidation process P may be terminated after an oxide layer 48 of a desired thickness has been formed. In other words, the oxidation process P may be terminated after a desired amount of trimming of the portions 10c of each first fin 10 has been achieved. The exact composition of the material of the oxide layer 48 can depend on the type of material forming the first and second layers 12, 14, 16, 18. Hence, the oxide layer 48 may be composed of a number of oxide layer portions having a composition dependent on a material of an underlying layer portion. However, typically the oxide layer 48 can comprise at least $SiO_2$.

Figure 6:
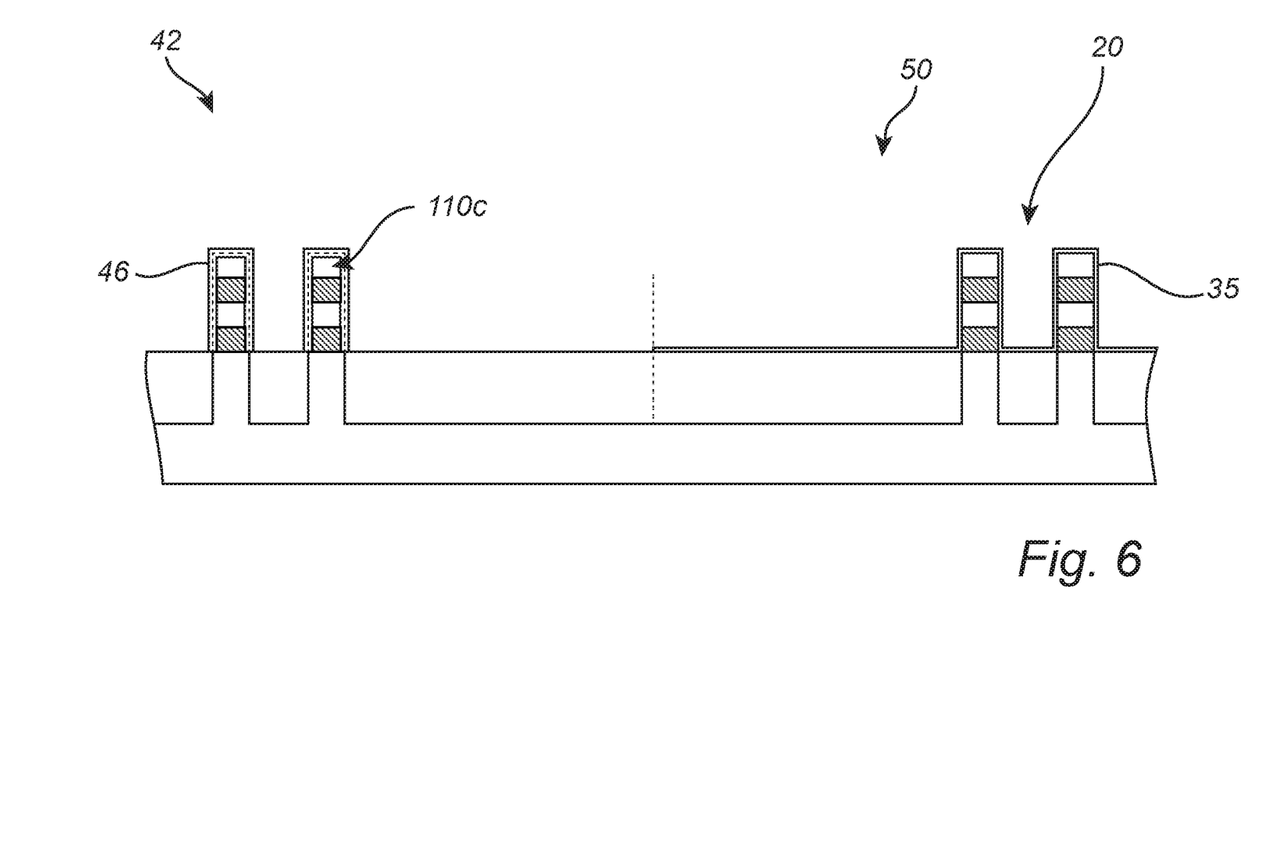

In FIG. 6, the second dummy gate part 36 of the second dummy gate structure 34 has been removed from the second fins 20. The second dummy gate part 36 may be removed by etching while the oxide layer 46 formed by the oxidized silicon capping layer 47 and the oxidized outer thickness portion 48 covers the trimmed fin portion 110c and hence acts as an etch mask.

In more detail, a mask layer may be formed to fill and cover the first gate trench section 42 and define an opening above the second dummy gate structure 34. The mask layer may comprise a spin-coated photoresist layer wherein the opening may be lithographically defined. The dummy gate cap part 38 may thereafter be removed to expose an upper surface of the second dummy gate part 36. The dummy gate cap part 38 may for instance be removed by a dry etching process, such as RIE. Thereafter, the second dummy gate part 36 may be removed by etching the exposed upper surface of the dummy gate 36. The mask layer may be removed prior to removing the second dummy gate 36 wherein the oxide layer 46 may counteract etching of the trimmed fin portion 110c during the etching of the second dummy gate 36. Alternatively, the mask layer may be used as an etch mask together with the oxide layer 46. Partial or even complete consumption of the mask layer may be allowed as at least the oxide layer 46 may remain to counteract etching of the trimmed fin portion 110c. A same etching chemistry as used for removing the first dummy gate 33 may be used to allow selective etching of the second dummy gate 36 with respect to the mask layer and/or oxide layer 46.

Figure 7:
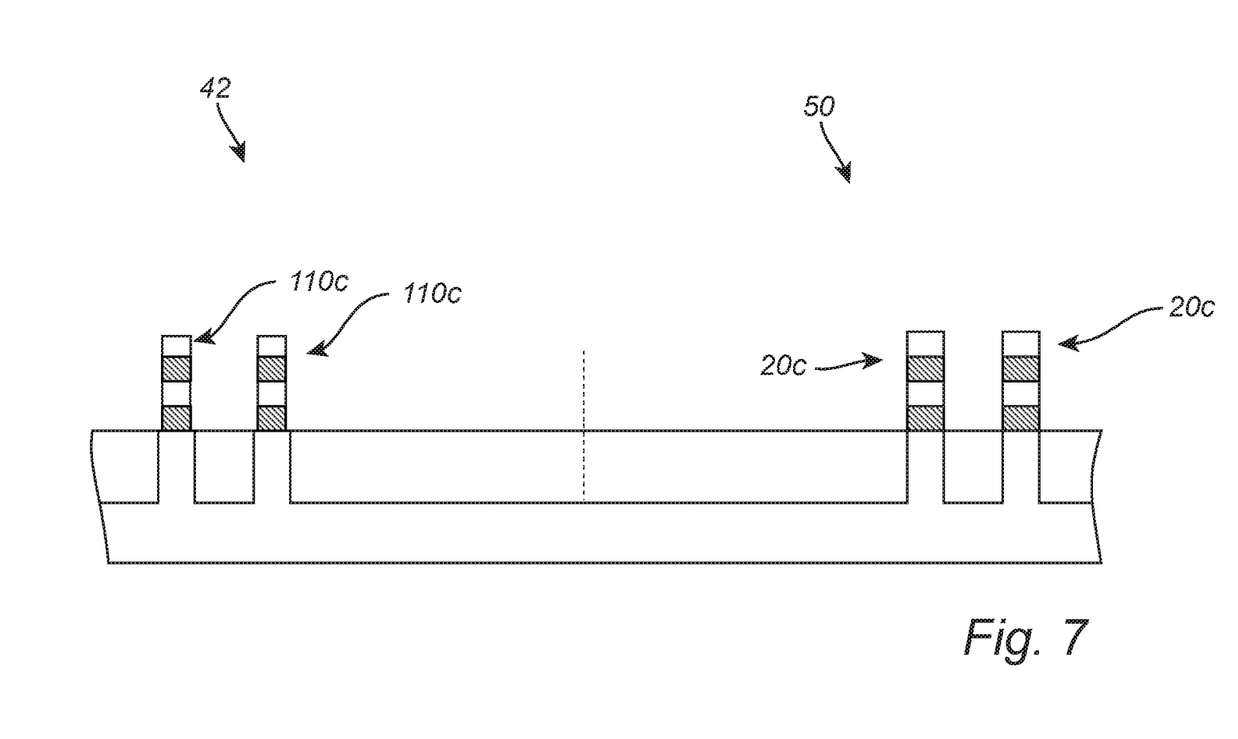

In FIG. 7, the dummy oxide 35 has been removed from the second fins 20 and the oxidized silicon capping layer 47 and the oxidized outer thickness portion 48 of the oxide layer 46 have been removed from the trimmed fin portions 110c. The dummy oxide 35 and the oxide layer 46 may be removed simultaneously using an oxide etch, for instance a diluted hydrofluoric acid (HF). The trimmed fin portions 110c can be thereby exposed in the first gate trench section 42. Fin portions 20c previously covered by the dummy gate structure 34 can be exposed in the second gate trench section 50.

Figure 8:
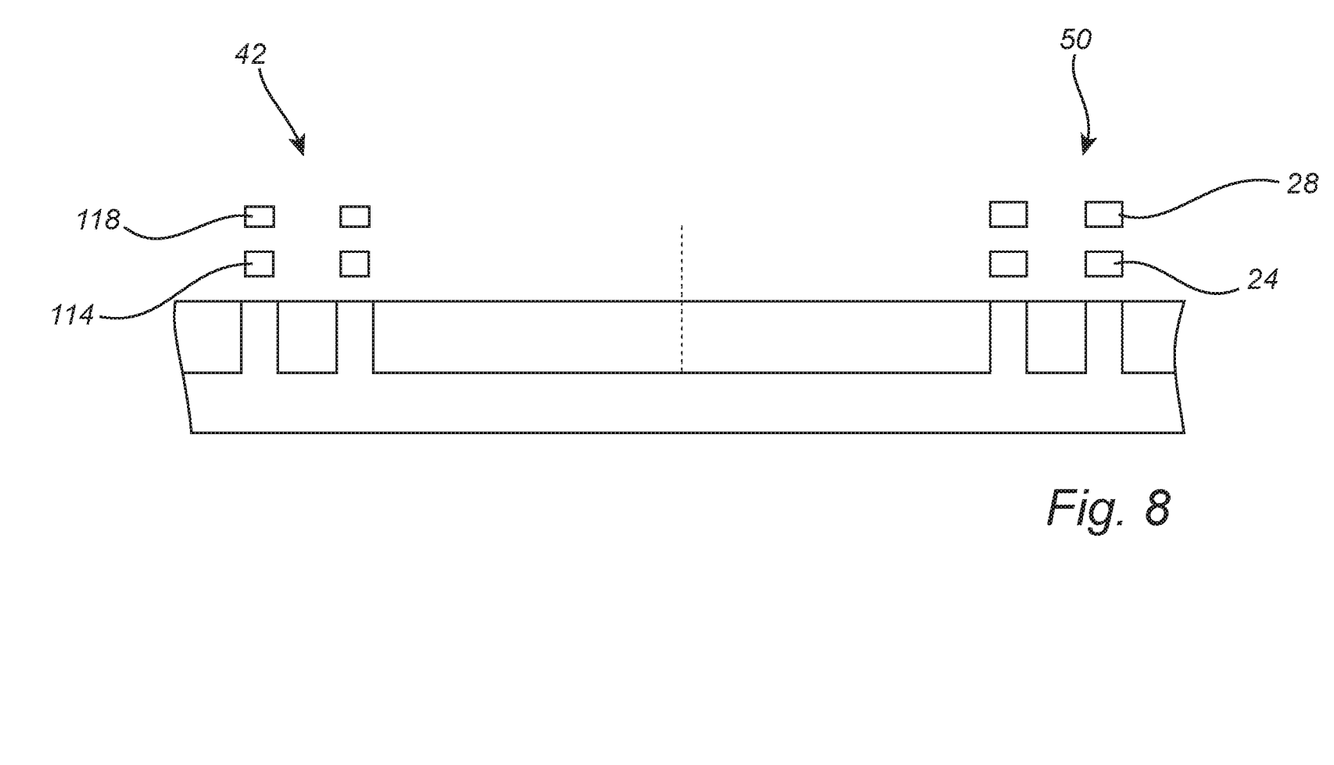

In FIG. 8, the laterally trimmed first layer portions 112, 116 exposed in the first gate trench section 42 and the first layer portions 22, 26 exposed in the second gate trench section 50 have been removed selectively to the laterally trimmed second layer portions 114, 118 in the first gate trench section 42 and the second layer portions 24, 28 in the second gate trench section 50. The second layers 114, 118, 24, 28, forming the channels, can thereby be "released" within the first and second gate trenches 42, 50. Due to the preceding trimming of the first fin portions 10c, the second layers 114, 118 in the first gate trench section 42 can present a smaller cross-sectional dimension than the second layers 24, 28 layers in the second trench section 50. For instance, a vapor phase-HCl based etchant may be used to achieve a selective etching.

Figure 9:
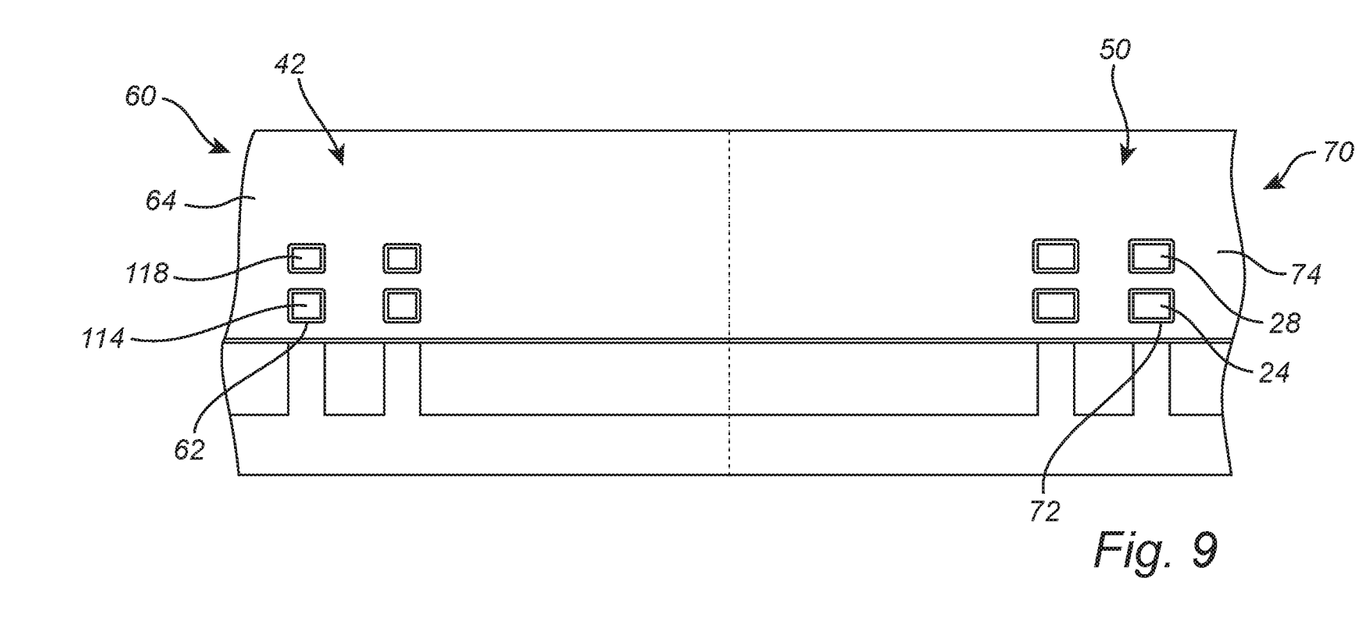

In FIG. 9, a final gate structure 60 has been formed around the channels (formed by the laterally trimmed second layer portions 114, 118) in the first gate trench section 42. A final gate structure 70 has been formed around the second layer portions 24, 28 in the second gate trench section 50. As shown in FIG. 9, and as may be understood from the above, the gate structures 60 and 70 may form parts of a common continuous final gate structure extending across and enclosing the second layer portions 114, 118, 24, 28. A gate dielectric may be deposited in the first and second gate trench sections 42, 50. Thereby, a gate dielectric 62 may be formed around the second layer portions 114, 118 and a gate dielectric 72 may be formed around the second layer portions 24, 28. The gate dielectric 62, 72 may be a conformally deposited ALD layer of $HfO_2$, $Al_2O_3$ or some other high-k gate dielectric. High-k dielectric deposition may optionally be preceded with deposition of a $SiO_2$ layer around the second layer portions 114, 118, 24, 28. One or more conductive layers, for instance, one or more work function metals and a fill metal may be deposited in the first and second trench sections 42, 50. Thereby a gate electrode part 64 may be formed around the second layer portions 114, 118 and a gate electrode part 74 may be formed around the second layer portions 24, 28. A single- or dual work function metal flow may be used, depending on the intended type of device. The work function metal(s) may be selected in accordance with the type conductivity type of the transistor devices which are to be formed. The work function metal(s) may, for instance, be deposited by ALD or CVD. The fill metal may for instance be ALD- or CVD-deposited tungsten (W) or cobalt (Co) or some other conventional conductive fill material.

In the above, the disclosed technology has mainly been described with reference to a limited number of examples. However, as is readily appreciated by a person skilled in the art, other examples than the ones disclosed above are equally possible within the scope of the disclosed technology, as defined by the appended claims.

For instance, although in the illustrated method, the fins 10 and 20 are shown to be formed with same lateral dimensions, it is in principle also possible to form the fins 10 and 20 with different heights and/or different widths. For instance, the first fins 10 may be formed as a wider fin formed by stack of nanosheets and the second fins 20 may be formed as a more narrow fin by a stack of nanowires, or vice versa. The method may then be used to further tailor the lateral dimensions of the layers of the fins 10. Moreover, optionally, the forming of the final gate structures 60, 70 may be preceded with one or more channel rounding process steps. More specifically, prior to removing the second dummy gate part 36, the laterally trimmed first and second layer portions 116, 118 may be subjected to a hydrogen annealing process. For instance, hydrogen anneal may be performed at 10 torr and 1000-1100° C. for a duration such that a desired degree of rounding is achieved. Alternatively or additionally hydrogen annealing may be performed subsequent to removing the first layer portions in the first and second gate trench sections, e.g., if channel rounding is desired also in the second gate trench section 50.

What is claimed is:

1. A method of forming a semiconductor device, the method comprising:
    removing a first dummy gate part extending across a first fin within a first gate trench section in an insulating layer,
        wherein the first dummy gate part is removed selectively to a second dummy gate part extending across a second fin within a second gate trench section in the insulating layer, and
        wherein each of the first and second fins is formed by a layer stack comprising a first layer and a second layer on the first layer, the first layer comprising $Si_{1-x}Ge_x$ and the second layer comprising $Si_{1-y}Ge_y$, wherein 0≤x≤1 and 0≤y≤1 and x≠y,
    forming a silicon capping layer on a portion of the first fin exposed in the first gate trench section,
    performing an oxidation process to oxidize the silicon capping layer and to oxidize an outer thickness portion of said portion of the first fin such that a trimmed fin portion comprising laterally trimmed first and second layer portions remains inside the oxidized outer thickness portion,
    subsequent to performing the oxidation process, removing the second dummy gate part while the oxidized silicon capping layer and the oxidized outer thickness portion covers said trimmed fin portion,
    removing the oxidized silicon capping layer and the oxidized outer thickness portion from said trimmed fin portion,
    removing the laterally trimmed first layer portion exposed in the first gate trench section and a first layer portion exposed in the second gate trench section, and
    forming a final gate structure around the laterally trimmed second layer portion in the first gate trench section and around a second layer portion in the second gate trench section.

2. A method according to claim 1, wherein the second dummy gate part is formed on a dummy oxide covering the second fin, the method comprising, subsequent to removing the second dummy gate part, removing the dummy oxide from the second fin, the oxidized silicon capping layer and the oxidized outer thickness portion using an oxide etch.

3. A method according to claim 1, wherein the first and second fins are formed with a same lateral dimension and with a same height.

4. A method according to claim 1, wherein the first and second fins are formed by patterning the first and second fins in an epitaxial layer stack comprising a first epitaxial layer and a second epitaxial layer on the first epitaxial layer, wherein the first layer of the first fin is formed by a first remaining portion of the first epitaxial layer, the second layer of the first fin is formed by a first remaining portion of the second epitaxial layer, and wherein the first layer of the second fin is formed by a second remaining portion of the first epitaxial layer, the second layer of the second fin is formed by a second remaining portion of the second epitaxial layer.

5. A method according to claim 1, wherein the silicon capping layer is epitaxially grown on said portion of the first fin.

6. A method according to claim 1, wherein said portion of the first fin and said portion of the second fin protrude above a bottom insulating layer covering an upper surface of a semiconductor substrate, wherein the trench insulating layer covers said upper surface during the forming of the silicon capping layer.

7. A method according to claim 1, wherein the first layer of the first and second fins are Ge- or SiGe-layers and the second layer of the first and second fins are Si-layers.

8. A method according to claim 1, wherein the first layer of the first and second fins are Si- or SiGe-layers and the second layer of the first and second fins are Ge-layers.

9. A method according to claim 1, wherein forming the final gate structure comprises depositing a gate dielectric and a gate electrode around said second layer portions in the first and second gate trenches sections.

10. A method according to claim 1, further comprising subjecting the trimmed fin portion to a hydrogen annealing process.

11. A method according to claim 1, wherein the first and second dummy gate parts form part of a common continuous dummy gate extending across both the first and second fins.

12. A method according to claim 1, wherein the laterally trimmed second layer portion in the first gate trench section forms a first channel of a first transistor, and the second layer portion in the second gate trench section forms a second channel of a second transistor.

13. A method according to claim 12, wherein the second layer portion in the second gate trench section has a lateral dimension greater than the trimmed second layer portion in the first gate trench section.

14. A method according to claim 13, wherein the second layer portion in the second gate trench section is configured to support greater drive current than the trimmed second layer portion in the first gate trench section.

15. A method according to claim 14, wherein the layer stack of the first fin and the layer stack of the second fin have a same number of layers.

16. A method according to claim 15, wherein the first dummy gate part is formed on a dummy oxide covering the first fin, the method comprising, subsequent to removing the first dummy gate part, removing the dummy oxide from the first fin.

17. A method according to claim 16, wherein removing the oxidized silicon capping layer and the oxidized outer thickness portion occurs simultaneous to removing the dummy oxide.

18. A method according to claim 17, wherein the first and second layers of the layer stack of the first and second fins comprise a first and second nanowire and/or a first and second nanosheet.

* * * * *